(12) United States Patent
Lambert et al.

(10) Patent No.: US 9,230,944 B1
(45) Date of Patent: Jan. 5, 2016

(54) TECHNIQUES AND CONFIGURATIONS ASSOCIATED WITH A CAPDUCTOR ASSEMBLY

(71) Applicant: Intel Corporation, Santa Clara, CA (US)

(72) Inventors: William J. Lambert, Chandler, AZ (US); Michael J. Hill, Gilbert, AZ (US); Kaladhar Radhakrishnan, Gilbert, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/464,484

(22) Filed: Aug. 20, 2014

(51) Int. Cl.
| | | |
|---|---|---|
| *H01L 21/00* | (2006.01) |
| *H01L 25/16* | (2006.01) |
| *H01L 49/02* | (2006.01) |
| *H01L 21/56* | (2006.01) |
| *H01L 23/31* | (2006.01) |
| *H01L 21/768* | (2006.01) |
| *H01L 23/528* | (2006.01) |
| *H01G 4/30* | (2006.01) |
| *H01G 4/38* | (2006.01) |

(52) U.S. Cl.
CPC .................. *H01L 25/16* (2013.01); *H01G 4/30* (2013.01); *H01G 4/38* (2013.01); *H01L 21/56* (2013.01); *H01L 21/768* (2013.01); *H01L 23/3157* (2013.01); *H01L 23/528* (2013.01); *H01L 28/10* (2013.01); *H01L 28/40* (2013.01)

(58) Field of Classification Search
None
See application file for complete search history.

(56) References Cited

U.S. PATENT DOCUMENTS

2010/0065942 A1 * 3/2010 Lin et al. ........................ 257/531

* cited by examiner

*Primary Examiner* — Kyoung Lee
(74) *Attorney, Agent, or Firm* — Schwabe, Williamson & Wyatt, P.C.

(57) ABSTRACT

Embodiments of the present disclosure are directed toward techniques and configurations associated with a capductor assembly. In one embodiment, a capductor assembly may include a semiconductor wafer and a plurality of inductors disposed on a first side of the semiconductor wafer. The plurality of inductors may be embedded in electrically insulative material having a plurality of interconnect structures disposed thereon. The plurality of interconnect structures may be configured to electrically couple the plurality of inductors to a die. The IC assembly may further include a plurality of capacitors disposed on a second side of the wafer disposed opposite the first side of the wafer. The plurality of capacitors may be electrically coupled with a second plurality of interconnect structures that may be configured to electrically couple the plurality of capacitors with the die. Other embodiments may be described and/or claimed.

24 Claims, 8 Drawing Sheets

TECHNIQUES AND CONFIGURATIONS ASSOCIATED WITH A CAPDUCTOR ASSEMBLY

FIELD

Embodiments of the present disclosure generally relate to the field of integrated circuits, and more particularly, to techniques and configurations associated with a capductor assembly.

BACKGROUND

Integrated voltage regulators (IVRs) may require both inductors and capacitors to properly carry out voltage regulation duties. Under the current state of the art, the inductors and capacitors of voltage regulators may compete for the same space of a package substrate. Consequently, it may be necessary to compromise on both the inductors and capacitors. For example, under the current state of the art, a footprint of the inductors may be reduced in an effort to make space available for the capacitors, while the number of capacitors may be limited to maintain sufficient space for the inductors. As a result of these compromises, IVR efficiency, reliability, or transient response may be impacted.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
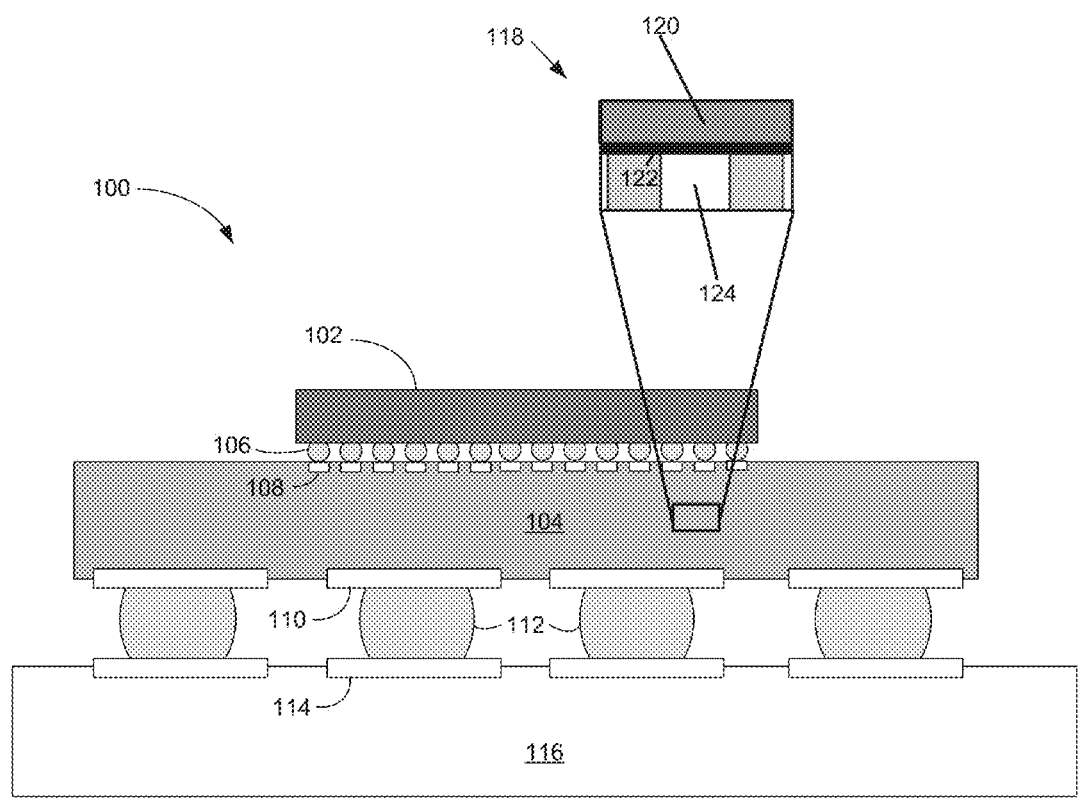
FIG. 1 schematically illustrates a cross-section side view of an example integrated circuit (IC) assembly, in accordance with various embodiments of the present disclosure.

Embodiments of the present disclosure describe techniques and configurations associated with a capductor assembly, which may be an integrated circuit (IC) assembly having integrated capacitors and inductors. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100. In some embodiments, the IC assembly 100 may include one or more dies (e.g., IC die 102) electrically and/or physically coupled with a package substrate 104, as can be seen. The package substrate 104 may further be electrically coupled with a circuit board 116, as can be seen.

Die 102 may be attached to package substrate 104 according to a variety of suitable configurations, including a flip-chip configuration, as depicted, or other configurations such as, for example, being embedded in the package substrate 104 or being configured in a wirebonding arrangement. In the flip-chip configuration, the die 102 may be attached to a surface of the package substrate 104 via die interconnect structures 106 such as bumps, pillars, or other suitable structures that may also electrically couple die 102 with the package substrate 104.

Die 102 may represent a discrete chip made from a semiconductor material and may be, include, or be a part of a processor, memory, or ASIC in some embodiments. In some embodiments, an electrically insulative material such as, for example, molding compound or underfill material (not pictured) may partially encapsulate a portion of die 102 and/or interconnect structures 106. Die interconnect structures 106 may be configured to route the electrical signals between die 102 and package substrate 104.

Package substrate 104 may include electrical routing features configured to route electrical signals to or from die 102. The electrical routing features may include, for example, traces disposed on one or more surfaces of package substrate 104 and/or internal routing features such as, for example, trenches, vias, or other interconnect structures to route electrical signals through package substrate 104. For example, in some embodiments, package substrate 104 may include electrical routing features (such as die bond pads 108) configured to receive the die interconnect structures 106 and route electrical signals between die 102 and package substrate 104. In embodiments, package substrate 104 may include one or more capductor assemblies integrated therein, such as that depicted by inset 118. Inset 118 depicts a capductor assembly having one or more inductors 120 disposed on one side of a substrate 122 and one or more capacitors 124 disposed on an opposite side of substrate 122. In some embodiments, such a capductor assembly may be embedded in a number of build-up layers having electrical routing features formed therein. Such an embodiment is discussed in greater detail in reference to FIGS. 5 and 6, below. The electrical routing features may be configured to route electrical signals between the one or more inductors 120 and die 102 as well as between the one or more capacitors 124 and die 102. In embodiments, a capductor module may be part of a voltage regulation circuit integrated into package substrate 104. Various embodiments of the capductor assembly are discussed in greater detail below. In some embodiments, the package substrate 104 is an epoxy-based laminate substrate having a core and/or build-up layers such as, for example, an Ajinomoto Build-up Film (ABF) substrate.

The circuit board 116 may be a printed circuit board (PCB) composed of an electrically insulative material such as an epoxy laminate. For example, the circuit board 116 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown), for example, vias, may be formed through the electrically insulating layers to route the electrical signals of the die 102 through the circuit board 116. The circuit board 116 may be composed of other suitable materials in other embodiments. In some embodiments, the circuit board 116 is a motherboard (e.g., motherboard 802 of FIG. 8).

Package-level interconnects such as, for example, solder balls 112 or land-grid array (LGA) structures may be coupled to one or more lands (hereinafter "lands 110") on the package substrate 104 and one or more pads 114 on the circuit board 116 to form corresponding solder joints that are configured to further route the electrical signals between the package substrate 104 and the circuit board 116. Other suitable techniques to physically and/or electrically couple the package substrate 104 with the circuit board 116 may be used in other embodiments.

Figure 2:
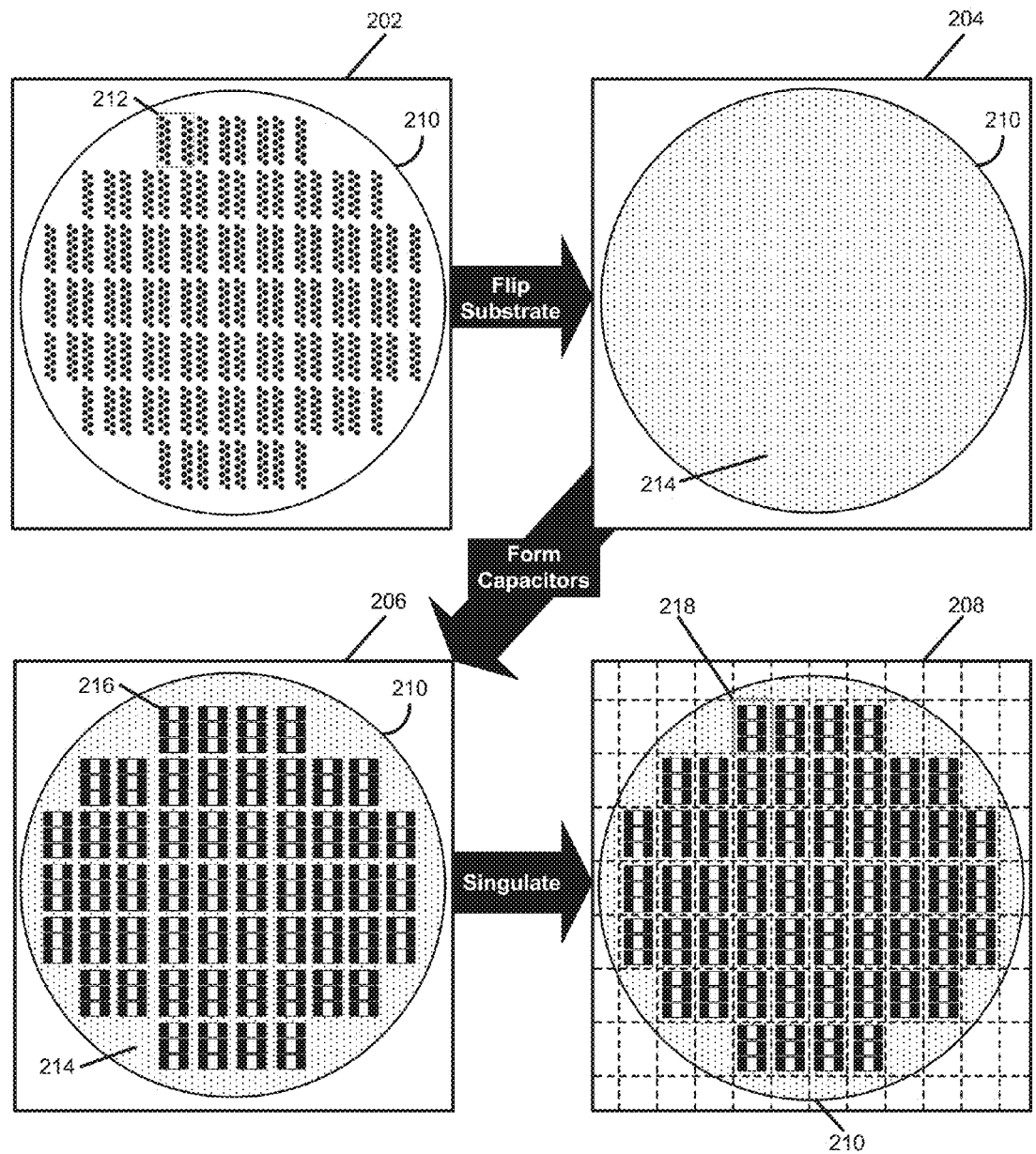
FIG. 2 is an illustrative representation of various views of an assembly process of capductor assemblies.

FIG. 2 is an illustrative representation of various views of an assembly process of capductor assemblies, in accordance with various embodiments of the present disclosure. The assembly process may begin in block 202 where a plurality of inductors may be formed on one side of a wafer 210. In other embodiments, the wafer may be provided with a plurality of inductors already formed thereon. The wafer may be composed of any appropriate electrically insulating material such as silicon, glass, etc. The inductors formed may be any type of conventional inductor including, but not limited to, magnetic core inductors (MCIs), air core inductors (ACIs), or any combination thereof. Such inductors may be fabricated in any conventional manner associated with the respective type of inductor. The inductors may be formed in patterns, such as the pattern depicted in 212, for later singulation.

The assembly process may then proceed to block 204 where wafer 210 may be flipped to expose side 214 of wafer 210. At block 206 capacitors (e.g., capacitor 216) may be formed on side 214 of the wafer. These capacitors may include, but are not limited to, discrete ceramic capacitors, metal-insulator-metal (MIM) capacitors, etc., which may be fabricated in any conventional manner. The process may then proceed to block 208 where individual capductor assemblies may be singulated into discrete chips (e.g., capductor assembly 218) by a saw or other suitable mechanism. This singulation may follow the horizontal and vertical dashed lines, also known as saw streets or scribe lines.

Figure 3:
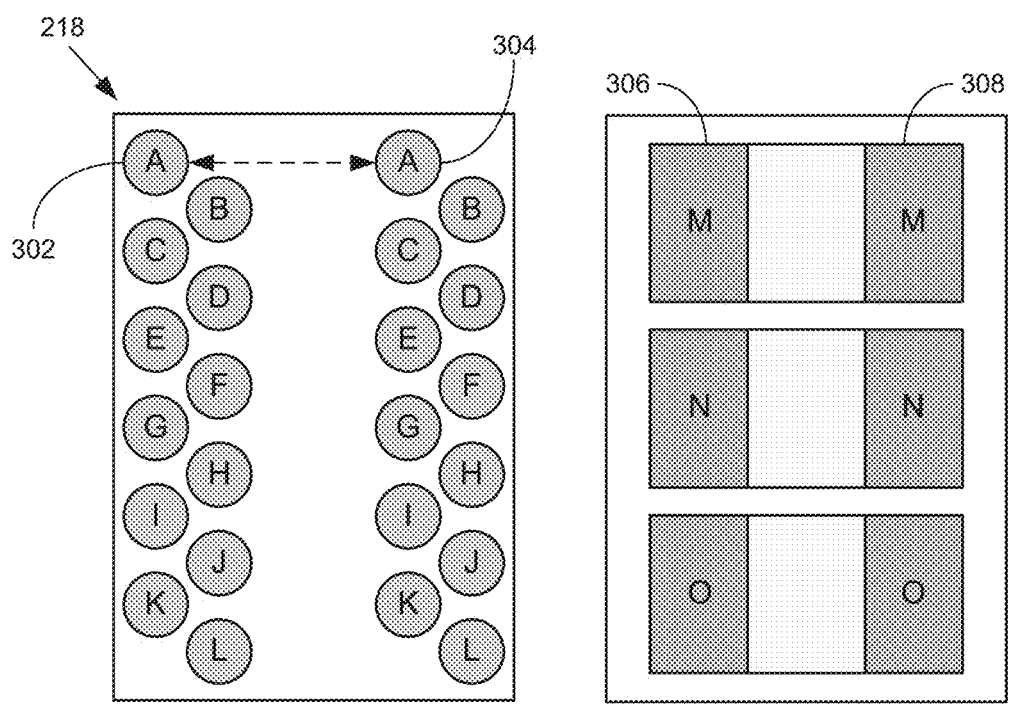
FIG. 3 is an illustrative view of a capductor assembly produced through the process depicted in FIG. 2, in accordance with various embodiments of the present disclosure.

FIG. 3 is a more detailed view of capductor assembly 218 of FIG. 2, in accordance with various embodiments of the present disclosure. Each inductor of capductor assembly 218 may be electrically coupled with a surface of the capductor assembly by two metal pads (e.g., pads 302 and 304) formed in a surface of the capductor assembly. Pads 302 and 304 may represent a positive and a negative electrical connection to inductor A. As can be seen, there are a total of twelve inductors, inductors A-L, depicted; however, it will be appreciated that this quantity of inductors has merely been selected for illustrative purposes and any number of inductors may be integrated into capductor assembly 218 without departing from the scope of this disclosure.

On a side opposite inductors A-L, a number of capacitors may be formed on capductor assembly 218. The capacitors may have electrical terminals (e.g., electrical terminals 306 and 308) formed in a surface of the capductor assembly. Electrical terminals 306 and 308 may represent a positive and a negative electrical connection to capacitor M. As can be seen, there are a total of three capacitors, capacitors M-O, depicted; however, it will be appreciated that, as with inductors A-L, this quantity of capacitors has merely been selected for illustrative purposes and any number of capacitors may be integrated into capductor assembly 218 without departing from the scope of this disclosure.

Figure 4:
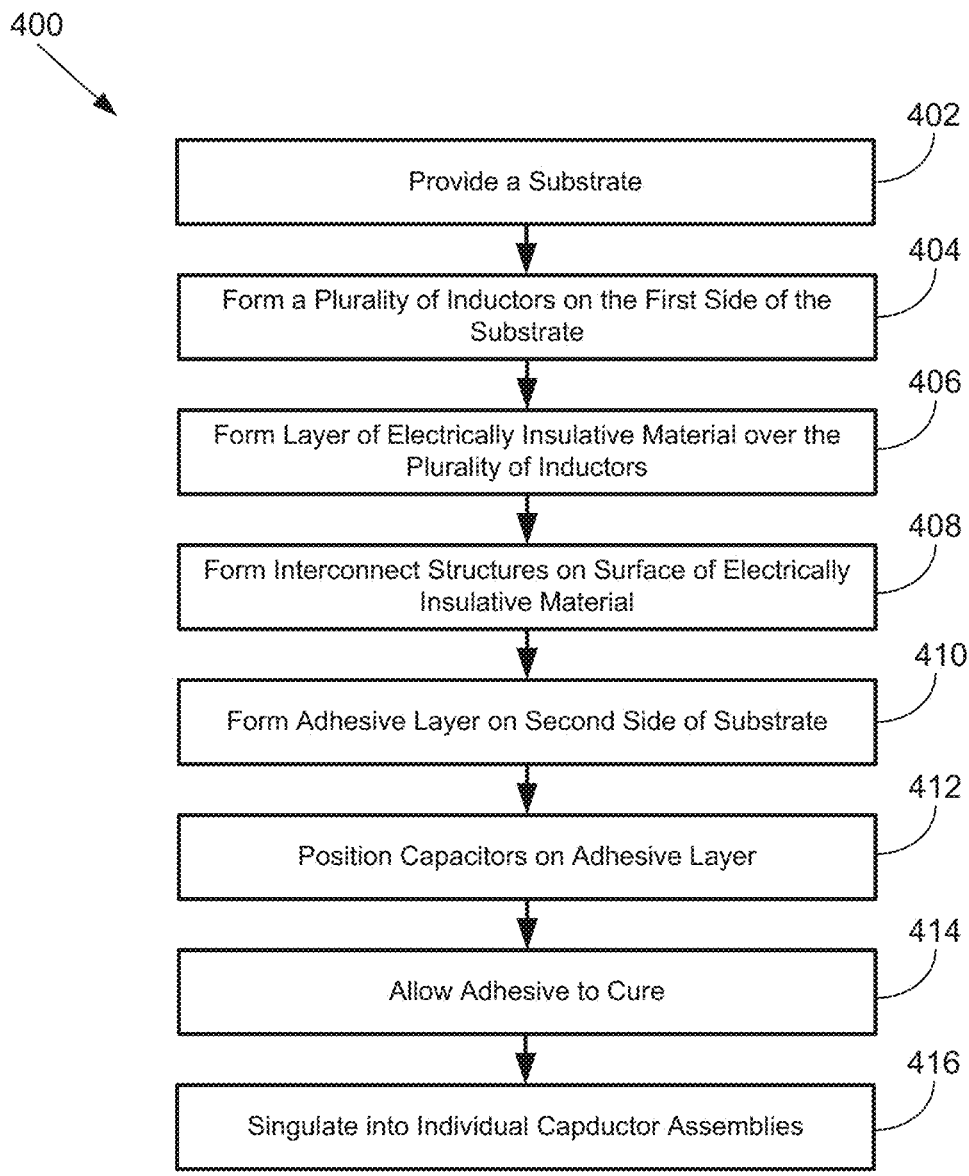
FIG. 4 is an illustrative flow diagram of an example capductor assembly process in accordance with various embodiments of the present disclosure.

FIG. 4 is an illustrative process flow 400 of selected procedures of a capductor assembly process in accordance with various embodiments of the present disclosure. Process 400 may begin at block 402 where a wafer may be provided. In embodiments, the wafer may be any type of semiconductor wafer including a silicon or glass wafer, for example. At block 404, a plurality of inductors may be formed on a first side of the wafer. As discussed above, the inductors may be any type of inductors, including, but not limited, to magnetic core inductors (MCIs) or air core inductors (ACIs). These inductors may be formed via any conventional process.

At block 406, a layer of electrically insulative material may be formed over a surface of the plurality of inductors formed at block 404. The electrically insulative material may be any type of dielectric material. At block 408, interconnect structures electrically coupling the inductors with a surface of the capductor assembly may be formed. In embodiments, this may include laser drilling vias through the electrically insulative material to reveal metal contacts of the inductors and metallizing the vias to form pads (e.g., pads 302 and 304) to electrically couple the metal contacts of the inductors with the surface of the capductor assembly.

In some embodiments, at block 410, an adhesive layer may be formed on a second side of the wafer, opposite the first side of the wafer. Such an adhesive layer may be an epoxy adhesive, double sided tape, or other suitable adhesive. Thereafter, at block 412, capacitors may be positioned on the adhesive layer to align with blocks of inductors formed on the opposite side of the wafer for later singulation. Once the capacitors have been positioned on the adhesive layer, the adhesive may be allowed to cure, at block 414, prior to singulation. Procedures depicted by blocks 410-414 may be applicable to embodiments of the present disclosure utilizing prefabricated capacitors, such as discrete ceramic capacitors, that may be formed prior to application of the capacitors to the capductor assembly. In such embodiments, a chip shooter, or other similar device, may be utilized for the positioning of the capacitors on the capductor assembly. In other embodiments, such as with metal-insulator-metal (MIM) capacitors, the capacitors may be formed in place on the second side of the wafer. In such embodiments, blocks 410-414 may be replaced with applicable procedures for forming the MIM capacitors. The process may then proceed to block 416 where the capductor assemblies may be singulated.

While process flow 400 depicts the formation of the inductors on the first side of the wafer prior to the formation of the capacitors on the second side of the wafer, it will be appreciated that this is merely for illustrative purpose. The order of these formations is not to be interpreted as limiting of the present disclosure and these formations may be reversed to form the capacitors prior to the formation of the inductors without departing from the scope of the present disclosure. In some embodiments, these inductors may be discrete inductors that may be formed on the wafer by attaching the discrete inductors to the wafer utilizing the same method utilized to attach the discrete capacitors discussed above.

Figure 5:
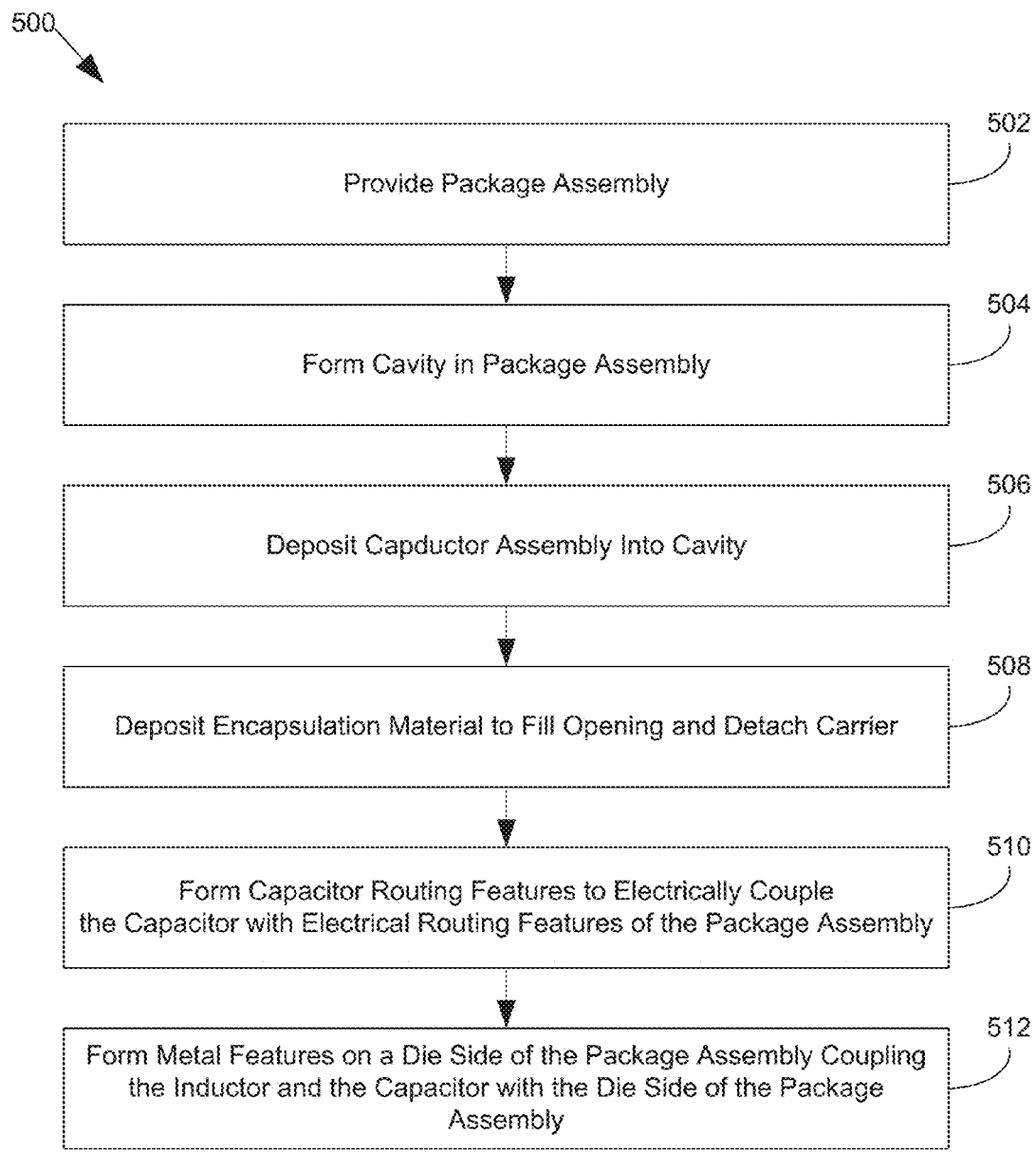
FIG. 5 is an illustrative flow diagram of a fabrication process for producing a package substrate having a capductor assembly embedded therein, in accordance with various embodiments of the present disclosure.
Figure 6:
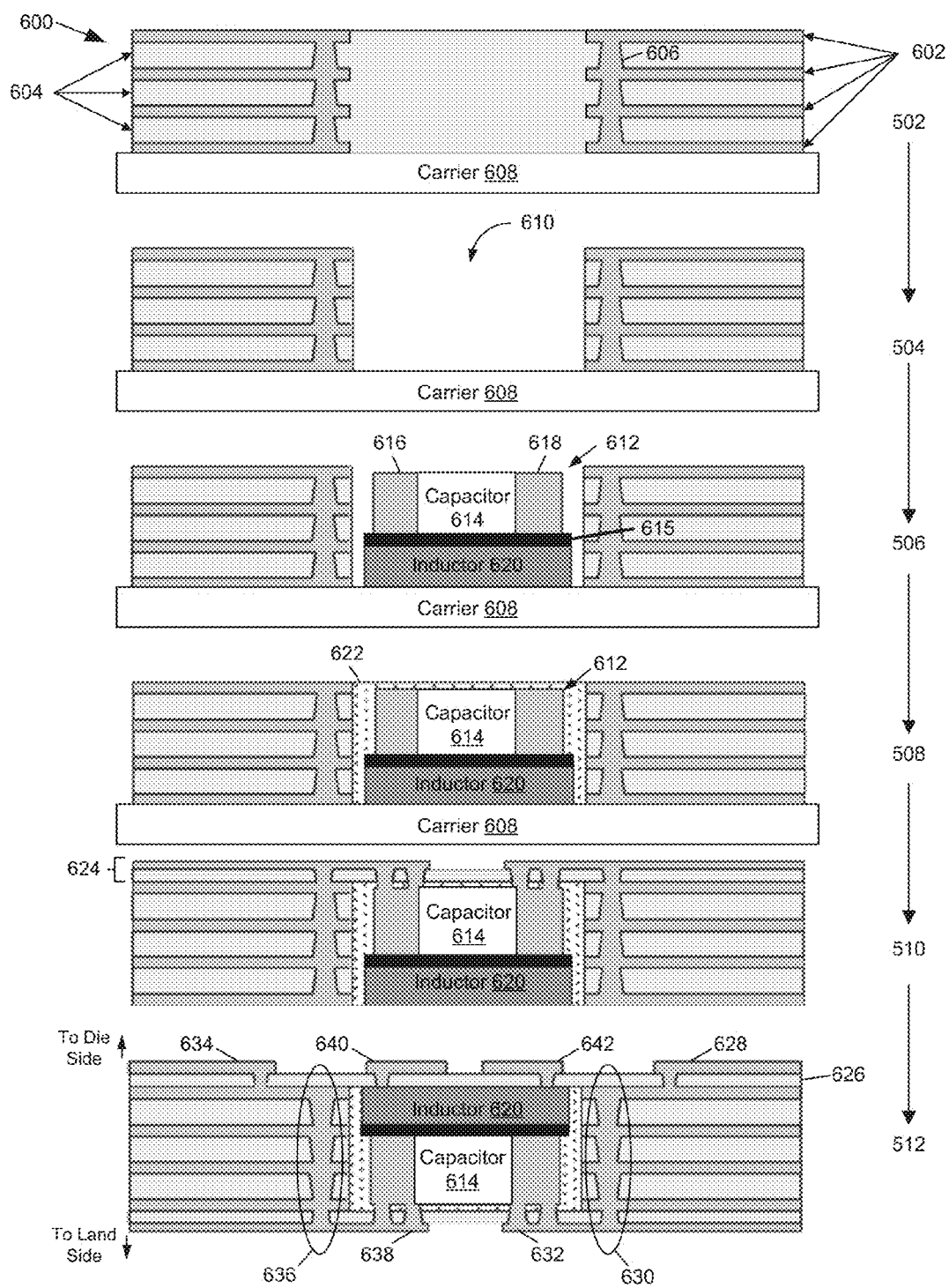
FIG. 6 provides cross-section views of selected operations illustrating stages in the package substrate fabrication process of FIG. 5, in accordance with various embodiments of the present disclosure.

FIG. 5 is an illustrative flow diagram of a fabrication process 500 for producing a package substrate having a capductor assembly embedded therein, such as package substrate 104 of FIG. 1. FIG. 6 provides cross-section views of selected operations illustrating stages in package substrate fabrication process 500, in accordance with an illustrative embodiment. As a result, FIG. 5 and FIG. 6 will be described in conjunction with one another. To aid in this description, the operations performed in FIG. 5 are referenced on the arrows moving from operation to operation in FIG. 6. In addition, not all reference numbers are depicted in each operation in FIG. 6 in an effort to not overly complicate the depictions.

Process 500 may begin at operation 502 where a package assembly (e.g., partially fabricated package assembly 600 of FIG. 6, herein after referred to as "package assembly 600" for simplicity) may be provided. In embodiments, package assembly 600 may include a number of build-up layers. These build-up layers may include a plurality of metallic layers 602. Metallic layers 602 may be separated by electrically insulative layers 604. In some embodiments, metallic layers 602 may be electrically coupled with one another by vias (e.g., via 606) formed in insulative layers 604. In some embodiments, the package assembly may be coupled with carrier 608. Carrier 608 may be, for example, a glass or ceramic carrier configured to provide torsional rigidity to the package assembly during the fabrication process.

At operation 504 an opening 610 may be formed in package assembly 600. Such an opening may be formed utilizing a laser, for example, or other suitable mechanism. Opening 610 may be formed large enough to accept placement of a capductor assembly therein. At operation 506, a capductor assembly 612 may be placed in opening 610. Capductor assembly 612 may include one or more capacitors (e.g., capacitor 614) disposed on one side of a wafer 615. In embodiments, capacitor 614 may have terminals 616 and 618 configured to route electrical signals into and out of capacitor 614. Capductor assembly 612 may also include one or more inductors (e.g., inductor 620) disposed on an opposite side of wafer 615.

At operation 508 an encapsulation material 622 may be deposited into an area surrounding capductor assembly 612. Encapsulation material 622 may be any appropriate electrically insulative material such as molding compound, underfill material, or package insulator material. Once encapsulation material 622 has hardened, carrier 608 may be decoupled from the package assembly. At operation 510, capacitor routing features, depicted here as additional build-up layers 624, may be formed to electrically couple terminals 616 and 618 of capacitor 614 with electrical routing features of the package assembly to route electrical signals to and from a side of the package assembly. In some embodiments, such a side of the package assembly may be a die side of the package assembly.

In some embodiments, at operation 512 an additional insulative layer 626 may be formed to insulate electrical connections on a surface of inductor 620 (e.g., pads 302 and 304 of FIG. 3). Additional metal features 628, 634, 640 and 642 may then be formed on a surface of insulative layer 626 to provide die side electrical connections to both inductor 620 and capacitor 614 in package assembly 600. As depicted, additional metal features 640 and 642 may directly couple the one or more inductors with the die side of the package assembly, while additional metal features 628 and 634 may couple capacitor 614 with the die side of the package assembly by way of electrical routing features 630/632, and 636/638, respectively. The electrical coupling of both the one or more inductors and the one or more capacitors with the die side of the package assembly may enable electrical connections between the die (e.g., die 102 of FIG. 1) and the one or more inductors and between the die and the one or more capacitors. After operation 512 the package assembly may have additional build-up processes performed thereon to form a package substrate (e.g., package substrate 104 of FIG. 1). In some embodiments, operation 510 and operation 512 may be performed in parallel. While discussed above in reference to a package, the above described operations, or equivalents thereof, could also be carried out for embedding capductor assembly 612 into a motherboard.

Figure 7:
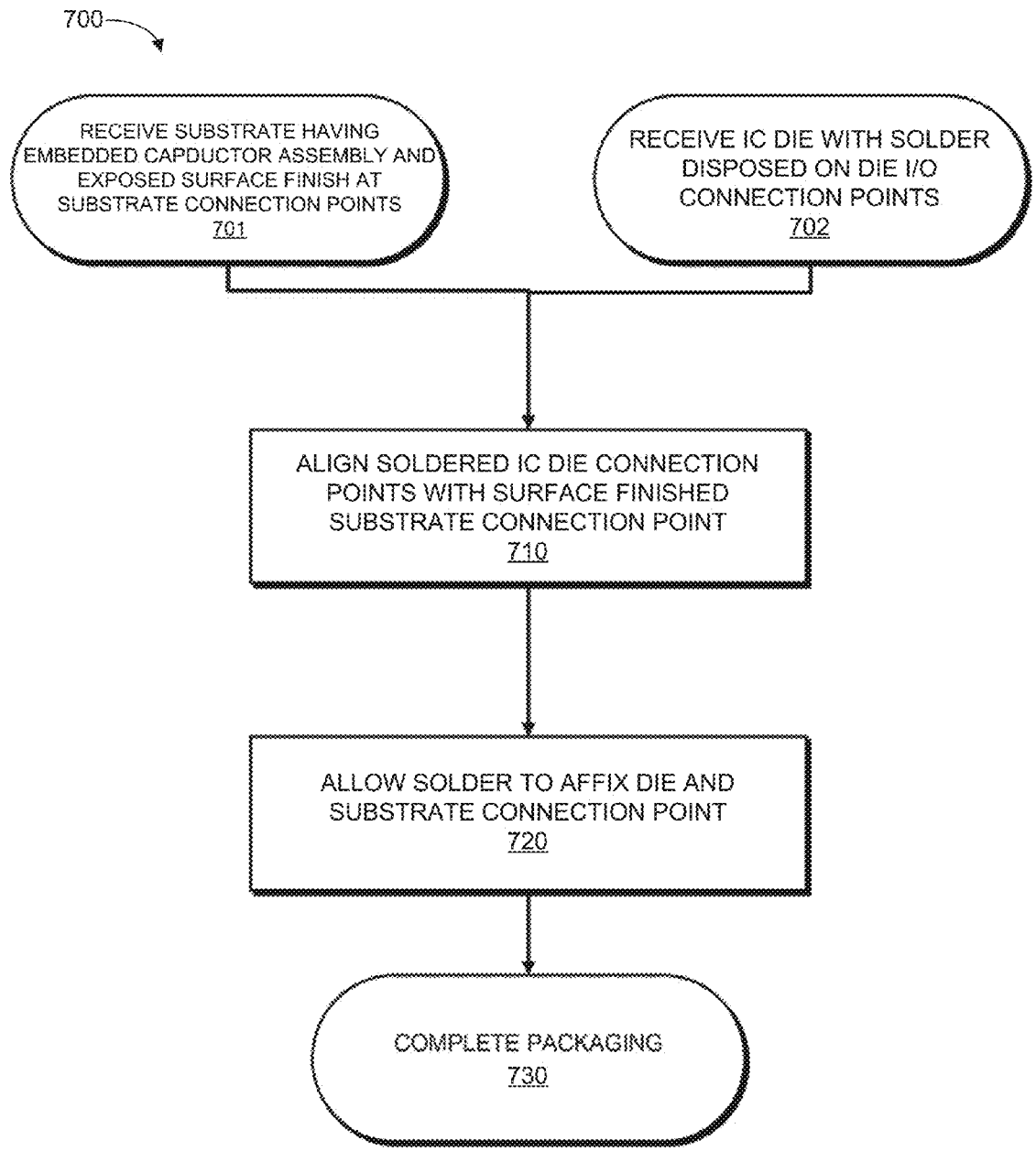
FIG. 7 is an illustrative flow diagram of an assembly process utilizing a package substrate in accordance with an embodiment of the present disclosure.

FIG. 7 is an illustrative flow diagram of an assembly process 700 utilizing a package substrate having a capductor assembly embedded therein, such as package substrate 104 of FIG. 1, in accordance with various embodiments of the present disclosure. Such a package substrate may be fabricated as discussed above in reference to FIGS. 5 and 6.

Assembly process 700 begins at operation 701 with receiving a package substrate (e.g., package substrate 104 of FIG. 1) with exposed surface finish at predetermined substrate connection points. As such, in the illustrative embodiments, no solder resist is present on the surface of the package substrate and no solder is placed on the surface finish prior to coupling a chip to the package substrate.

At operation 702, an IC die may be received with solder bumps disposed on the die connection points. While the IC die may generally be of any conventional type, in a particular embodiment, the IC die may be a processor, such as a microprocessor, having a large I/O count. At operation 710, the IC die may be aligned with the surface finished substrate to have the soldered IC die connection points aligned with the surface finished substrate connection points. The die side solder is then alloyed at operation 720 to affix the die to the substrate connection points, which completes the packaging at operation 730.

Figure 8:
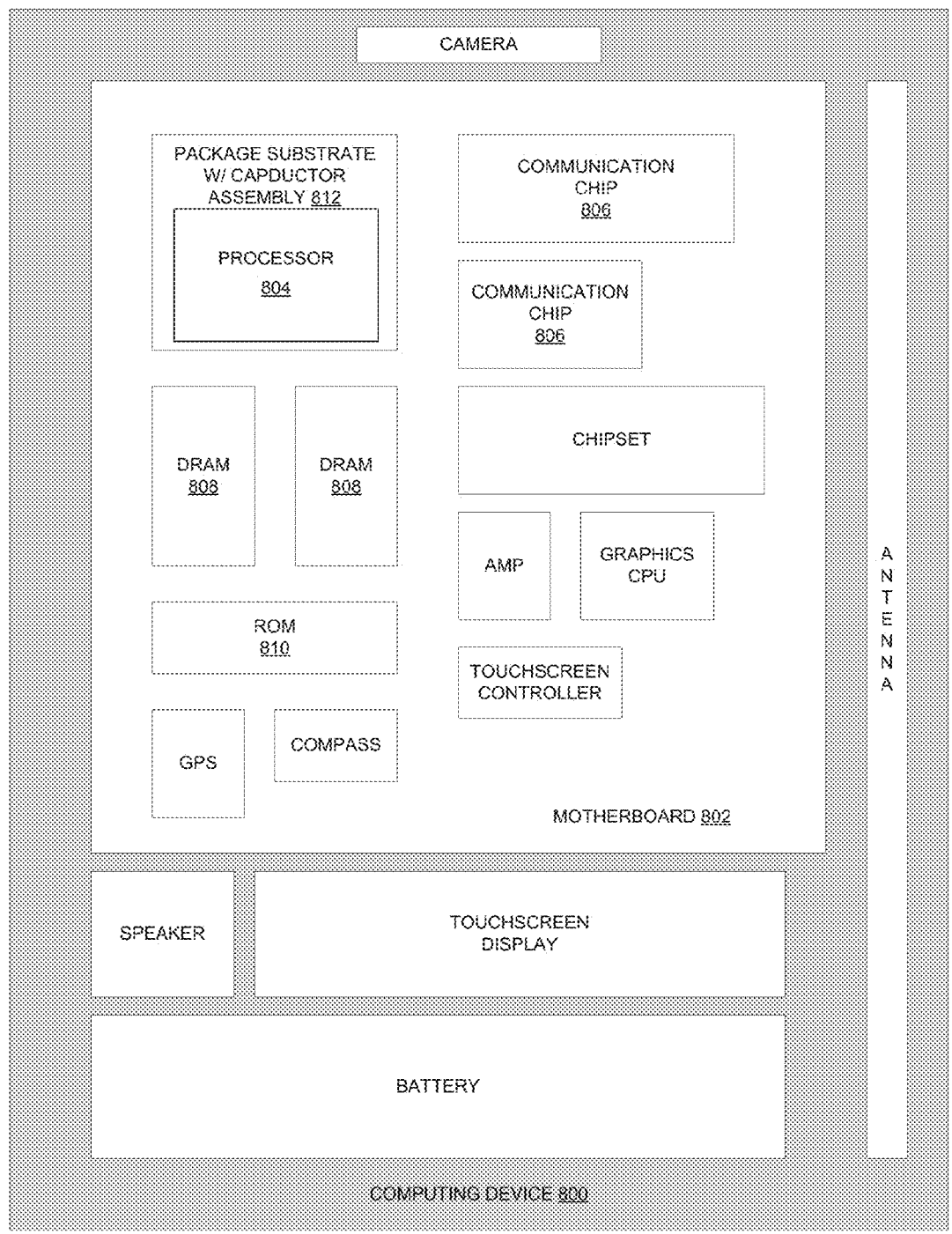
FIG. 8 schematically illustrates a computing device that includes a package substrate having a capductor assembly, in accordance with various embodiments of the present disclosure.

Embodiments of the present disclosure may be implemented into a system using any suitable hardware and/or software to configure as desired. FIG. 8 schematically illustrates a computing device that includes a die as described herein, in accordance with some embodiments. The computing device 800 may house a board such as motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., dynamic random access memory (DRAM) 808), non-volatile memory (e.g., read-only memory (ROM) 810), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, EV-DO, and others.

The processor 804 of the computing device 800 may be packaged in an IC assembly (e.g., IC assembly 100 of FIG. 1) that includes a package substrate 812 as described herein. For example, the circuit board 116 of FIG. 1 may be a motherboard 802 and the processor 804 may be a die 102 mounted on package substrate 812, which may be package substrate 104 as described herein. Package substrate 812 and motherboard 802 may be coupled together using package-level interconnects as described herein. The term "processor" may refer to any device or portion of a device that processes electronic data from registers and/or memory to transform that electronic data into other electronic data that may be stored in registers and/or memory.

The communication chip 806 may also include a die (e.g., die 102 of FIG. 1) that may be packaged in an IC assembly (e.g., IC assembly 100 of FIG. 1) that includes a package substrate 104 as described herein. In further implementations, another component (e.g., memory device or other integrated circuit device) housed within the computing device 800 may include a die (e.g., die 102 of FIG. 1) that may be packaged in an IC assembly (e.g., IC assembly 100 of FIG. 1) that includes a package substrate 104 as described herein.

In addition, computing device 800 may include one or more computer-readable media, such as DRAM 808 or ROM 810. These computer readable media may have instructions stored thereon, which when executed by processor 804 may cause computing device 800 to perform any of the processes described herein, such as the process described in reference to FIG. 2, above.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

EXAMPLES

According to various embodiments, the present disclosure describes a number of examples. Example 1 is an integrated circuit (IC) assembly comprising: a semiconductor wafer; a plurality of inductors disposed on a first side of the semiconductor wafer, wherein the plurality of inductors are at least partially embedded in electrically insulative material; a first plurality of interconnect structures disposed on a surface of the electrically insulative material, wherein the plurality of interconnect structures are electrically coupled to the plurality of inductors and configured to electrically couple the plurality of inductors to a die; a plurality of capacitors disposed on a second side of the wafer, the second side of the wafer disposed opposite the first side of the wafer, wherein the plurality of capacitors are electrically coupled with a second plurality of interconnect structures that are configured to electrically couple the plurality of capacitors with the die.

Example 2 may include the subject matter of Example 1, wherein the plurality of inductors are selected from a group consisting of: magnetic core inductors (MCIs) or air core inductors (ACIs).

Example 3 may include the subject matter of Example 1, wherein the plurality of capacitors are disposed on an adhesive layer that physically couples the capacitors with the wafer.

Example 4 may include the subject matter of Example 3, wherein the plurality of capacitors comprise discrete ceramic capacitors and the second plurality of interconnect structures comprise metallic terminals of the discrete ceramic capacitors.

Example 5 may include the subject matter of Example 1, wherein the electrically insulative material is a first electrically insulative material, and wherein the plurality of capacitors comprises metal-insulator-metal (MIM) capacitors, and wherein the second plurality of interconnect structures is disposed in a surface of a second electrically insulative material that is disposed over the plurality of capacitors.

Example 6 may include the subject matter of any one of Examples 1-5, wherein the die is a processor.

Example 7 is a method of forming a module comprising: providing a wafer; forming a plurality of inductors on a first side of the wafer; depositing an electrically insulative material over the plurality of inductors to at least partially embed the inductors in the electrically insulative material; forming a first plurality of interconnect structures on a surface of the electrically insulative material, wherein the first plurality of interconnect structures are electrically coupled to the plurality of inductors, and wherein the first plurality of interconnect structures are configured to electrically couple the plurality of inductors to a die; forming a plurality of capacitors on a second side of the wafer, wherein the second side of the wafer is disposed opposite the first side of the wafer, and wherein the plurality of capacitors have a second plurality of interconnect structures formed on the plurality of capacitors to electrically couple the plurality of capacitors to the die.

Example 8 may include the subject matter of Example 7, wherein the plurality of inductors is selected from a group consisting of: magnetic core inductors (MCIs) or air core inductors (ACIs).

Example 9 may include the subject matter of Example 7, wherein forming the plurality of capacitors on the second side of the wafer further comprises: depositing an adhesive layer on the second side of the wafer; and depositing the plurality of capacitors onto the adhesive layer.

Example 10 may include the subject matter of Example 9, wherein the plurality of capacitors are discrete ceramic capacitors and the second plurality of interconnect structures are metallic terminals of the discrete ceramic capacitors.

Example 11 may include the subject matter of Example 7, wherein the electrically insulative material is a first electrically insulative material, and wherein forming the plurality of capacitors on the second side of the wafer further comprises: forming a plurality of metal-insulator-metal (MIM) capacitors on the second side of the wafer; depositing a second electrically insulative material over the MIM capacitors to at least partially embed the MIM capacitors in the second electrically insulative material; and forming the second plurality of interconnect structures in a surface of the second electrically insulative material.

Example 12 may include the subject matter of any one of Examples 7-11, wherein the wafer is a semiconductor wafer.

Example 13 may include the subject matter of any one of Examples 7-11, wherein the die is a processor.

Example 14 is an apparatus comprising: a plurality of build-up layers having a plurality of electrical routing features and an integrated circuit (IC) assembly embedded therein, wherein the IC assembly includes: a plurality of inductors disposed on a first side of a semiconductor wafer and at least partially embedded in an electrically insulative material; a first plurality of interconnect structures electrically coupled with the plurality of inductors and disposed on a surface of the electrically insulative material, wherein a first subset of the plurality of electrical routing features route electrical signals between the first plurality of interconnect structures and a side of the apparatus; and a plurality of capacitors disposed on a second side of the wafer, the second side of the wafer disposed opposite the first side of the wafer, wherein the plurality of capacitors are electrically coupled with a second plurality of interconnect structures, and wherein a second subset of the plurality of electrical routing features route electrical signals between the second plurality of interconnect structures and the side of the apparatus.

Example 15 may include the subject matter of Example 14, wherein the plurality of inductors are selected from a group consisting of: magnetic core inductors (MCIs) or air core inductors (ACIs).

Example 16 may include the subject matter of Example 14, wherein the plurality of capacitors are disposed on an adhesive layer that physically couples the capacitors with the wafer.

Example 17 may include the subject matter of Example 16, wherein the plurality of capacitors comprise discrete ceramic capacitors and the second plurality of interconnect structures comprise metallic terminals of the discrete ceramic capacitors.

Example 18 may include the subject matter of Example 14, wherein the electrically insulative material is a first electrically insulative material, and wherein the plurality of capacitors comprises metal-insulator-metal (MIM) capacitors, and wherein the second plurality of interconnect structures is disposed in a surface of a second electrically insulative material that is disposed over the plurality of capacitors.

Example 19 may include the subject matter of any one of Examples 14-18, wherein the IC assembly is a passive portion of an integrated voltage regulator and further comprising an active voltage regulation circuit to regulate voltage provided to a die side of the package core, wherein the active voltage regulation circuit is electrically coupled with the IC assembly.

Example 20 may include the subject matter of any one of Examples 14-18, wherein the apparatus is a package assembly and the side of the apparatus is a die side of the package assembly.

Example 21 may include the subject matter of any one of Examples 14-18, wherein the apparatus is a motherboard.

Example 22 is a method of forming a package comprising: providing a package core; laser forming a cavity into the package core; depositing into the cavity an assembly having a plurality of inductors disposed on a first side of a semiconductor wafer and a plurality of capacitors disposed on a second side, opposite the first side, of the semiconductor wafer; depositing an encapsulation material over the assembly to embed the assembly into the package; forming capacitor routing features to electrically couple the plurality of capacitors with a die side of the package core; and forming inductor routing features to electrically couple the plurality of inductors with the die side of the package core.

Example 23 may include the subject matter of Example 22, wherein the plurality of inductors are selected from a group consisting of: magnetic core inductors (MCIs) or air core inductors (ACIs).

Example 24 may include the subject matter of Example 22, wherein the plurality of capacitors comprise discrete ceramic capacitors.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

For the purposes of this description, a computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read-only-memory (CD-ROM), compact disk-read/write (CD-R/W), and DVD.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) assembly comprising:
a semiconductor wafer;
a plurality of inductors disposed on a first side of the semiconductor wafer, wherein the plurality of inductors are at least partially embedded in electrically insulative material;
a first plurality of interconnect structures disposed on a surface of the electrically insulative material, wherein the plurality of interconnect structures are electrically coupled to the plurality of inductors and configured to electrically couple the plurality of inductors to a die;
a plurality of capacitors disposed on a second side of the wafer, the second side of the wafer disposed opposite the first side of the wafer, wherein the plurality of capacitors are electrically coupled with a second plurality of interconnect structures that are configured to electrically couple the plurality of capacitors with the die.

2. The IC assembly of claim 1, wherein the plurality of inductors are selected from a group consisting of: magnetic core inductors (MCIs) or air core inductors (ACIs).

3. The IC assembly of claim 1, wherein the plurality of capacitors are disposed on an adhesive layer that physically couples the capacitors with the wafer.

4. The IC assembly of claim 3, wherein the plurality of capacitors comprise discrete ceramic capacitors and the second plurality of interconnect structures comprise metallic terminals of the discrete ceramic capacitors.

5. The IC assembly of claim 1, wherein the electrically insulative material is a first electrically insulative material, and wherein the plurality of capacitors comprises metal-insulator-metal (MIM) capacitors, and wherein the second plurality of interconnect structures is disposed in a surface of a second electrically insulative material that is disposed over the plurality of capacitors.

6. The IC assembly of claim 1, wherein the die is a processor.

7. A method of forming a module comprising:
providing a wafer;
forming a plurality of inductors on a first side of the wafer;
depositing an electrically insulative material over the plurality of inductors to at least partially embed the inductors in the electrically insulative material;
forming a first plurality of interconnect structures on a surface of the electrically insulative material, wherein the first plurality of interconnect structures are electrically coupled to the plurality of inductors, and wherein the first plurality of interconnect structures are configured to electrically couple the plurality of inductors to a die;
forming a plurality of capacitors on a second side of the wafer, wherein the second side of the wafer is disposed opposite the first side of the wafer, and wherein the plurality of capacitors have a second plurality of interconnect structures formed on the plurality of capacitors to electrically couple the plurality of capacitors to the die.

8. The method of claim 7, wherein the plurality of inductors is selected from a group consisting of: magnetic core inductors (MCIs) or air core inductors (ACIs).

9. The method of claim 7, wherein forming the plurality of capacitors on the second side of the wafer further comprises:
depositing an adhesive layer on the second side of the wafer; and
depositing the plurality of capacitors onto the adhesive layer.

10. The method of claim 9, wherein the plurality of capacitors are discrete ceramic capacitors and the second plurality of interconnect structures are metallic terminals of the discrete ceramic capacitors.

11. The method of claim 7, wherein the electrically insulative material is a first electrically insulative material, and wherein forming the plurality of capacitors on the second side of the wafer further comprises:
- forming a plurality of metal-insulator-metal (MIM) capacitors on the second side of the wafer;
- depositing a second electrically insulative material over the MIM capacitors to at least partially embed the MIM capacitors in the second electrically insulative material; and
- forming the second plurality of interconnect structures in a surface of the second electrically insulative material.

12. The method of claim 7, wherein the wafer is a semiconductor wafer.

13. The method of claim 7, wherein the die is a processor.

14. An apparatus comprising:
- a plurality of build-up layers having a plurality of electrical routing features and an integrated circuit (IC) assembly embedded therein, wherein the IC assembly includes:
  - a plurality of inductors disposed on a first side of a semiconductor wafer and at least partially embedded in an electrically insulative material;
  - a first plurality of interconnect structures electrically coupled with the plurality of inductors and disposed on a surface of the electrically insulative material, wherein a first subset of the plurality of electrical routing features route electrical signals between the first plurality of interconnect structures and a side of the apparatus; and
  - a plurality of capacitors disposed on a second side of the wafer, the second side of the wafer disposed opposite the first side of the wafer, wherein the plurality of capacitors are electrically coupled with a second plurality of interconnect structures, and wherein a second subset of the plurality of electrical routing features route electrical signals between the second plurality of interconnect structures and the side of the apparatus.

15. The apparatus of claim 14, wherein the plurality of inductors are selected from a group consisting of: magnetic core inductors (MCIs) or air core inductors (ACIs).

16. The apparatus of claim 14, wherein the plurality of capacitors are disposed on an adhesive layer that physically couples the capacitors with the wafer.

17. The apparatus of claim 16, wherein the plurality of capacitors comprise discrete ceramic capacitors and the second plurality of interconnect structures comprise metallic terminals of the discrete ceramic capacitors.

18. The apparatus of claim 14, wherein the electrically insulative material is a first electrically insulative material, and wherein the plurality of capacitors comprises metal-insulator-metal (MIM) capacitors, and wherein the second plurality of interconnect structures is disposed in a surface of a second electrically insulative material that is disposed over the plurality of capacitors.

19. The apparatus of claim 14, wherein the IC assembly is a passive portion of an integrated voltage regulator and further comprising an active voltage regulation circuit to regulate voltage provided to a die side of the package core, wherein the active voltage regulation circuit is electrically coupled with the IC assembly.

20. The apparatus of claim 14, wherein the apparatus is a package assembly and the side of the apparatus is a die side of the package assembly.

21. The apparatus of claim 14, wherein the apparatus is a motherboard.

22. A method of forming a package comprising:
- providing a package core;
- laser forming a cavity into the package core;
- depositing into the cavity an assembly having a plurality of inductors disposed on a first side of a semiconductor wafer and a plurality of capacitors disposed on a second side, opposite the first side, of the semiconductor wafer;
- depositing an encapsulation material over the assembly to embed the assembly into the package;
- forming capacitor routing features to electrically couple the plurality of capacitors with a die side of the package core; and
- forming inductor routing features to electrically couple the plurality of inductors with the die side of the package core.

23. The method of claim 22, wherein the plurality of inductors are selected from a group consisting of: magnetic core inductors (MCIs) or air core inductors (ACIs).

24. The method of claim 22, wherein the plurality of capacitors comprise discrete ceramic capacitors.

* * * * *